SIGNAL MODIFIER

Filed May 29, 1957 3 Sheets-Sheet 1

May 29, 1962 J. MARLEY 3,037,143

SIGNAL MODIFIER

Filed May 29, 1957 3 Sheets-Sheet 3

United States Patent Office 3,037,143

Patented May 29, 1962

3,037,143
SIGNAL MODIFIER

John Marley, Roslyn Heights, N.Y., assignor to Hazeltine Research, Inc., Chicago, Ill., a corporation of Illinois Filed May 29, 1957, Ser. No. 662,518
12 Claims. (Cl. 315—27)

The present invention is directed to signal modifiers and, more particularly, to signal modifiers which employ semiconductor junction devices that have a carrier-storage characteristic for developing a transient output signal having a wave form which is substantially different from that of the applied input signal. While signal modifiers of the type under consideration have a variety of applications, they are particularly useful for pulse-forming purposes, in timing or marking circuits, as frequency dividers, and as sweep generators for developing scanning currents of saw-tooth wave form. Accordingly, the invention will be described in connection with a pulse-forming apparatus, a frequency divider, and a sweep generator. As used in this specification, the term "carrier-storage characteristic" refers to the phenomenon whereby: when biasing potentials sufficient to render a given semiconductor junction nonconductive are applied to such a junction existing in a conductive state, the junction remains conductive for a finite time after the application of such biasing potentials.

It has recently been determined that semiconductor signal-translating devices such as junction diode rectifiers and power transistors have a carrier-storage characteristic or property sometimes referred to as a hole-storage characteristic. The ordinary rectifying crystal diode does not display this property at least over the audio frequency and the low kilocycle range. It has been determined that when a semiconductor junction rectifier is energized by an alternating signal such as a sine wave having a frequency greater than a predetermined value, for example, in the range from about 5 kilocycles to 30 kilocycles, substantial conduction occurs not only during one-half cycle of the applied wave but also during a portion of the succeeding half cycle. Apparently when the polarity of the sine wave reverses, the carriers developed in the region of the junction during the preceding half cycle of the wave are not completely swept out of one of the zones and hence continue to diffuse or drift across the junction for an interval of time until they are finally depleted. This results in a reverse conduction which substantially extends the time of the low-impedance conduction of the device so that it is coextensive with that portion of the applied sine wave which ordinarily would not support good conduction. The end of the reverse conduction is marked by an abrupt change in rectifier impedance characteristic from the low reverse impedance to a high reverse impedance.

Applicant has determined that these phenomena and semiconductor junction devices such as junction power diodes and junction power transistors may be employed for various purposes such as those mentioned above when the devices are employed in suitable electrical circuits.

It is an object of the invention, therefore, to provide a new and improved signal modifier which employs a semiconductor junction device.

It is another object of the invention to provide a new and improved signal modifier which utilizes the carrier-storage characteristic of a semiconductor junction device.

It is a further object of the invention to provide a new and improved sweep generator which includes a semiconductor junction device for developing a scanning current of saw-tooth wave form.

It is a still further object of the present invention to provide a new and improved signal modifier which is relatively simple in construction and inexpensive to manufacture.

In accordance with a particular form of the invention, a signal modifier comprises an alternating-signal supply means, and circuit means coupled to that supply means and including means resonant at a frequency at least twice that of the alternating signal and including a semiconductor junction device having a carrier-storage characteristic for developing across the device a transient signal having a wave form substantially different from that of the aforesaid alternating signal.

For a better understanding of the present invention, together with other and further objects thereof, reference is had to the following description taken in connection with the accompanying drawings, and its scope will be pointed out in the appended claims.

Referring to the drawings:

FIG. 1 is a circuit diagram, partly schematic, of an electrical apparatus including a signal modifier in accordance with a particular form of the present invention;

FIG. 1*a* is a representation of a modified portion of the signal modifier of FIG. 1;

Figure 1:
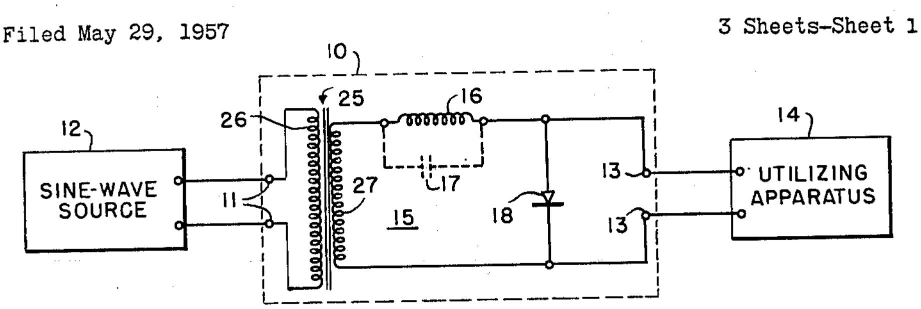

*Description of FIG. 1 Apparatus Including Signal Modifier*

Referring now more particularly to FIG. 1 of the drawings, the electrical apparatus there represented includes a signal modifier 10 in accordance with a particular embodiment of the invention which includes an alternating-signal supply means including a pair of input terminals 11, 11. This supply means may also be considered to be a suitable alternating-signal source, for example, a sine-wave source 12 having its output terminals connected to the input terminals 11, 11. The signal modifier 10 also comprises circuit means 15 coupled to the supply means by way of a transformer 25 and including means in the form of an inductor 16 resonant at a frequency at least twice that of the alternating signal supplied by the source 12 and including a semiconductor junction device 18 having a carrier-storage characteristic such that the cutoff interval of the device is substantially that of a half period of the resonant frequency of the inductor 16 for developing across the device 18 a transient signal having a wave form substantially different from that of the alternating signal. For some applications the transformer 25 may be selected to have sufficient inductance that it effectively includes the inductor 16. The semiconductor junction device 18 conveniently may be a semiconductor junction power rectifier or, alternatively, may comprise the emitter-to-base junction of a power transistor. The transformer 25 has a primary winding 26 coupled to the input terminals 11, 11 and a secondary winding 27 which is coupled in series relation with the inductor 16 and the device 18. A condenser 17, which is represented in broken-line construction since it may comprise in whole or in part the inherent capacitance of the circuit means 15, is shown as being connected in parallel with the inductor 16 so as to resonate the latter at a frequency which is at least twice that of the signal from the source 12. The losses in the transformer 25 preferably should be low and the tuned circuit formed by the parallel combination of the inductor 16 and the condenser 17 should have a rather high Q.

The signal modifier 10 also includes a pair of output terminals 13, 13, one of which is connected to the junction of the inductor 16 and the device 18, while the other thereof is connected to the junction of the winding 27 for the purpose of supplying the output signals of the modifier to a suitable utilizing apparatus 14. The apparatus 14, like the sine-wave source 12, may be of conventional construction and the former may be a trigger circuit which is responsive to the output signal or pulses developed by the signal modifier 10.

*Explanation of Operation of Apparatus Including Signal Modifier 10 of FIG. 1*

Figure 2:
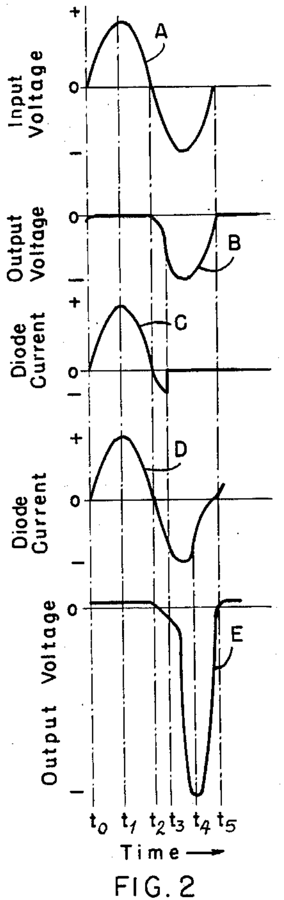
FIG. 2 is a graph utilized in explaining the operation of the signal modifier of FIG. 1.

In considering the operation of the apparatus of FIG. 1, reference is made to the curves of FIG. 2. Curve A represents a single cycle of a sine wave supplied by the source 12 to the input terminals 11, 11 of the modifier 10. Assuming for the moment that the inductor 16 is not resonated by a suitable condenser 17 at a frequency which is at least twice that of the sine wave of curve A, the output voltage which would then be developed between the output terminals 13, 13 for application to the utilizing apparatus 14 would have the wave form represented by Curve B. It will be noticed that during the interval $t_0$—$t_2$ when the sine-wave voltage of curve A is swinging positively, the semiconductor junction rectifier 18 is rendered conductive and a relatively small voltage appears at the terminals 13, 13. During the interval $t_2$—$t_5$ when the half cycle of the wave of curve A swings negatively, the rectifier 18 is nonconductive for the greater portion of that interval and, as would be expected, a negative-going pulse, as shown in curve B, appears at the output terminals 13, 13. At time $t_2$ marking the end of the positive half cycle of the input voltage wave of curve A, all the carriers developed in the region of the junction of the rectifier device are not swept out of one of the zones and, hence, they continue to diffuse or drift across the junction for a short interval of time $t_2$—$t_3$ until they are finally depleted. It will be observed from curve B that the output voltage does not follow until approximately time $t_3$. For the circuit condition assumed above, the diode current may be represented by curve C wherein forward conduction through the diode occurs during the interval $t_0$—$t_2$ and, by virtue of the carrier storage property of the transistor, reverse conduction indicated by the short duration negative swing of curve C occurs during the interval $t_2$—$t_3$. At the time $t_3$ the carriers in the semiconductive material of the junction rectifiers are depleted and the output current decreases abruptly to zero and remains at that value for the remainder of the second half cycle of the voltage wave of curve A occurring during the interval $t_2$—$t_5$.

With the foregoing explanation representing a brief introduction to the carrier storage phenomenon occurring for a single cycle of operation in a semiconductor junction device such as the rectifier 18, let us now consider the operation of the signal modifier 10 in accordance with the invention when the tuned circuit 16, 17 is resonant at a frequency at least twice that of the sine-wave signal supplied by the source 12. It will also be recalled that the selection of the rectifier 18 with relation to the parameters of the tuned circuit 16, 17 is such that the cutoff time or interval of the rectifier is substantially that of the loaded-down half period of the tuned circuit. Referring now to curve D of FIG. 2, it will be seen that during the interval $t_2$—$t_5$ a large reverse current flows in the rectifier 18. This current flows through inductor 16. When the carriers in the rectifier 18 are depleted, the rectifier attempts to cut off and the energy stored in the magnetic field of the inductor goes through a half cycle of oscillation in the tuned circuit 16, 17. After this half cycle is over, a large portion of the stored energy is returned to the junction rectifier 18. This energy adds to that which is introduced during the next positive half cycle (not shown) of the input voltage wave of curve A so that the next succeeding interval of reverse conduction would be lengthened. This action continues during succeeding cycles of the voltage wave applied to the terminals 11, 11. For convenience, however, it will be considered that the output current of the signal modifier 10 corresponds to that represented by curve D for the single cycle represented for the interval $t_0$—$t_5$.

A series of output voltage pulses corresponding to the one represented by curve E is developed at the output terminals 13, 13. When the large reverse current represented by curve D and occurring during the interval $t_2$—$t_3$ decreases abruptly at about time $t_4$, there is developed the large negative-going pulse of curve E having its peak value in the vicinity of time $t_4$. From the foregoing explanation it will be seen that the rectifier 18 is rendered conductive in response to predetermined or positive polarity portions of the voltage wave of curve A to store carriers in a portion of the rectifier in sufficient quantities to maintain that rectifier conductive for a substantial portion of the succeeding opposite or negative polarity portions of the aforesaid voltage, thereby storing energy during those negative polarity portions in the resonant means or tuned circuit 16, 17 so that each time the rectifier becomes nonconductive during a negative polarity portion of the aforesaid voltage, a half cycle of oscillation is established in the resonant means and the stored energy is effective during a succeeding conductive interval of the rectifier to augment the storage of carriers, and there is developed across the rectifier a transient voltage similar to the single pulse represented by curve E of FIG. 2 having a wave form substantially different from that of the applied sine-wave voltage. The amplitude of this pulse may be several or many times the peak-to-peak input voltage of curve A depending upon the Q of the inductor 16, the peak-current flow, and the losses in the output load associated with the signal modified 10. The large amplitude periodic voltage pulses of curve E developed from the small amplitude sine-wave input voltage of curve A may be employed for a variety of control purposes such as in timing or marking circuits.

Figure 3:
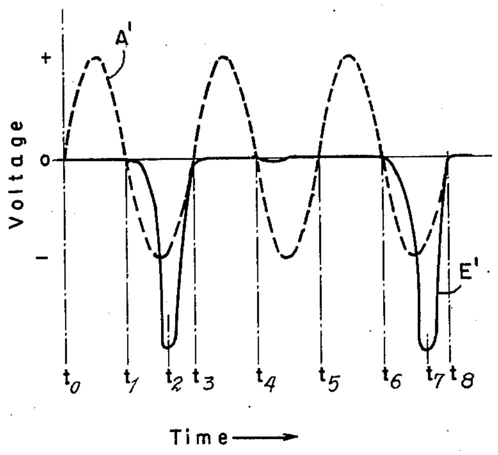
FIG. 3 is another graph employed for the same purpose.

A circuit such as that represented in FIG. 1 may also be employed as a frequency divider. If the magnitude of the applied sine-wave voltage is raised or its period is shortened, a point may be reached in the operation of the circuit wherein the carriers stored in the rectifier 18 permit conduction for the entire negative swing of some of the half cycles of the applied sine-wave voltage. Such a situation is represented by FIG. 3 of the drawings wherein the broken line curve A′ represents a large amplitude sine-wave input voltage and curve E′ represents the series of output pulses developed by the signal modifier 10. During the first negative half cycle of the voltage of curve A′ occurring during the interval $t_1$—$t_3$, there is developed a negative-going pulse at approximately time $t_2$ having an amplitude somewhat smaller than that intended to be represented by curve E of FIG. 2. This pulse is due to shock excitation of oscillation in inductor 16, the oscillatory voltage completing one-half cycle and reversing polarity at about the time the sine wave also reverses, thus returning some of the previously swept out carriers to rectifier 18. During the succeeding forward conduction interval $t_3$—$t_4$ the carriers stored in the rectifier 18 are further increased during the entire positive swing of the voltage wave of curve A′. Consequently, conduction is maintained by carrier depletion during the entire next succeeding negative half cycle corresponding to the interval $t_4$—$t_5$, and inductor 16 is not shocked into oscillation. Therefore, it does not operate to restore the carriers then swept from the rectifier 18. The result is that at the succeeding half cycle occurring during the interval $t_5$—$t_6$, the carrier storage fails to reach a level sufficient to maintain the rectifier 18 conductive during the entire following interval $t_6$—$t_8$ being depleted to develop at approximately time $t_7$ a rather large voltage pulse represented by curve E′. For the condition considered with reference to FIG. 3, the signal modifier 10 effects a division of two and this develops on alternate negative-going half cycles of the applied voltage wave a series of relatively large amplitude negative-going pulses. By suitable proportioning of the parameters of unit 10, other divisions may be realized.

Figure 1A:
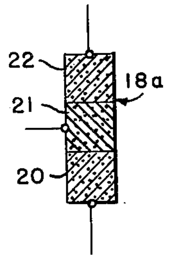

FIG. 1*a* represents diagrammatically a junction power transistor 18*a* which may be employed in lieu of the junction power rectifier 18 of FIG. 1. Transistor 18*a* includes, in the order named, an emitter zone 20, a base zone 21, and a collector zone 22. By connecting only the emitter and base zones in circuit and leaving the collector zone floating, the transistor 18*a* may be employed for the purposes explained above in connection with the rectifier 18 of FIG. 1.

While applicant does not wish to be limited to any particular set of circuit constants, the following have proved useful in the signal modifier represented in FIG. 1:

| | |
|---|---|
| Inductor **16** | 2 millihenries. |
| Transformer **25** | 3/1 stepdown, with a ferrite core. |
| Rectifier **18** | Type CK722 or 2N158 junction power transistor (emitter and base zones only employed). |
| Sine wave applied to terminals **11, 11** | 30 volts peak-to-peak, 10–20 kilocycles. |

Figure 4:
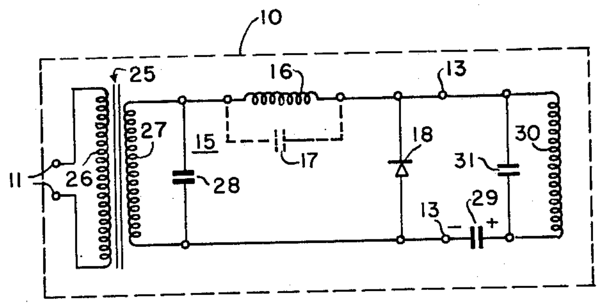
FIG. 4 is a circuit diagram of a modification of the FIG. 1 signal modifier.

*Description of FIG. 4 Signal Modifier*

Referring now to FIG. 4 of the drawings, there is represented a signal modifier 10 which is generally similar to that represented in FIG. 1. Accordingly, corresponding elements are designated by the same reference numerals. While the signal modifier of FIG. 4 has a variety of applications, it will be considered to be employed as a sweep generator for developing a periodic scanning current of saw-tooth wave form for application to the line-scanning winding of the cathode-ray tube of a television receiver. To that end, the output terminals 13, 13 are coupled through a storage condenser 29 to the terminals of a line-scanning winding 30 having connected in parallel therewith a condenser 31 which together constitute a means resonant at a frequency at least twice that of the sine-wave voltage applied to the terminals 11, 11. More particularly, the parallel combination 30, 31 is resonant at a frequency which is approximately five times that of the 15.75 kilocycle voltage applied to the input terminals 11, 11. A condenser 28 is connected in parallel with the secondary winding 27 of the transformer 25 and may comprise the inherent capacitance of the input circuit of the signal modifier. This condenser preferably is resonant with the inductor 16 at a frequency corresponding to that of the sine-wave voltage applied to the terminals 11, 11. The rectifier 18 is represented as being poled in the opposite sense from that of the rectifier 18 of FIG. 1. However, it may be poled in the same sense in which case the developed waves are of polarities opposite to those represented.

*Explanation of Operation of Signal Modifier of FIG. 4*

Figure 5:
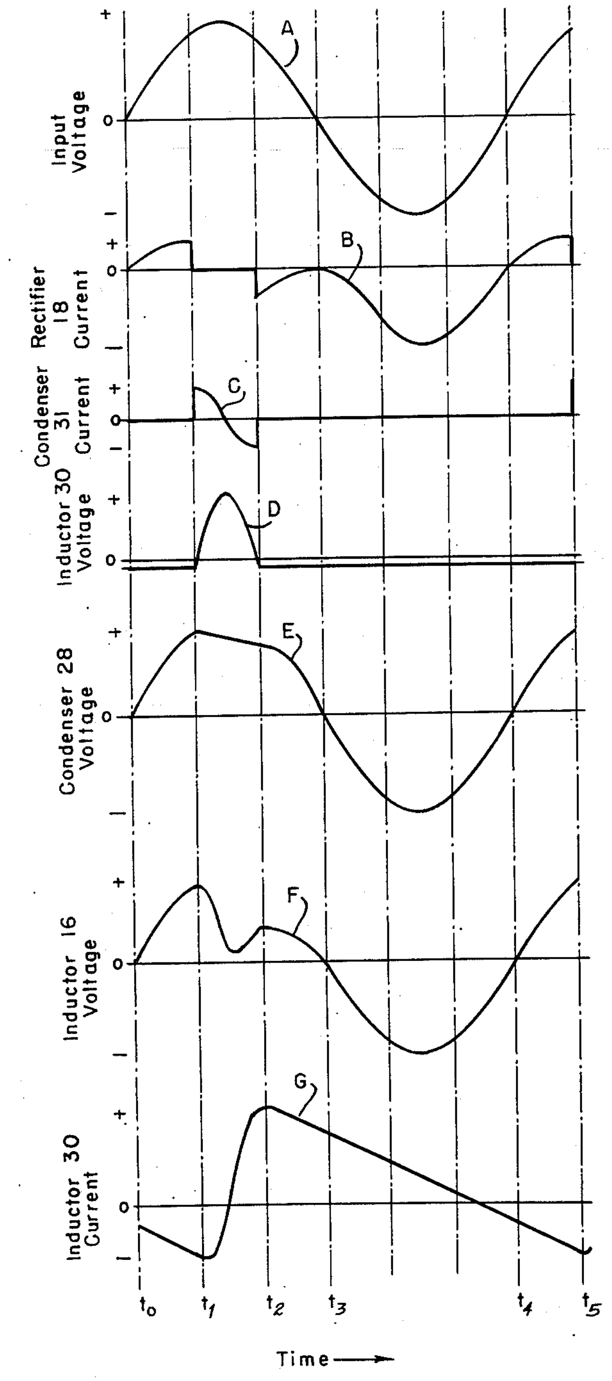
FIG. 5 is a graph employed in explaining the operation of the FIG. 4 modifier.

The operation of the FIG. 4 signal modifier or sweep generator may best be explained in connection with the wave forms of FIG. 5 wherein curve A represents the sine-wave voltage applied to the input termnals 11, 11 and curve G represents the saw-tooth current developed in the line-scanning winding 30 of a cathode-ray tube. Curve G depicts during interval $t_0$—$t_1$ the final part of the preceding trace portion of the saw-tooth current. During interval $t_1$—$t_2$ there is shown the retrace portion of the scanning wave and during interval $t_2$—$t_5$ there is represented a complete trace portion of the scanning wave. During the latter part of the interval $t_0$—$t_1$, reverse conduction occurs in the rectifier 18 as represented by curve B as a result of the carrier storage occurring in the rectifier from a preceding cycle of the applied sine-wave voltage such as that represented by curve A. At time $t_1$, a depletion of these carriers occurs and the rectifier cuts off abruptly as may be seen in curve B and remains in that condition for the retrace interval $t_1$—$t_2$. During the retrace interval, the tuned circuit 30, 31 is shock-excited and resonates for a half cycle at a resonant frequency which is high enough so that the impedance of the 15.75 kilocycle tuned circuit 28, 16 represents a high impedance. The wave form of the current flow in the condenser 31 of the resonant circuit 30, 31 is represented by curve C of FIG. 5. During the retrace interval $t_1$—$t_2$, the voltage across the inductor 30 swings positively as represented by curve D and, at time $t_2$, the rectifier 18 is rendered conductive and recovers the energy which was stored in the winding 30 at the end $t_1$ of the preceding trace interval. This recovered energy maintains conduction in the rectifier for a further portion of the applied sine wave, that is during the interval $t_2$—$t_3$ which, in turn, is followed by the usual forward conduction half cycle which takes place during the interval $t_3$—$t_4$ when the applied sine wave of curve A swings in a negative sense and, hence, in a manner to render the diode 18 conductive. The storage condenser 29 acquires a charge which permits the diode 18 to conduct for the entire interval $t_2$—$t_5$ despite the variation in the diode current represented by curve B of FIG. 5. The voltage appearing across the inductor 16 is represented by curve F and that appearing across the condenser 28 is represented by curve E. It will be seen that both of these voltages experience a dip during the interval $t_1$—$t_2$. The current in the inductor 30 during the trace interval $t_2$—$t_5$ is relatively linear as represented by curve G. Reverse conduction occurring in the diode during the interval $t_4$—$t_5$ as a result of carrier storage therein is responsible for extending the trace portion of the scanning current to include the interval $t_4$—$t_5$. Thus, the storage action of the condenser 29 taken in connection with that of the rectifier 18, which is conductive to a varying degree over substantially the entire interval $t_2$—$t_5$, are effective to develop the required relatively long trace interval followed by a relatively short retrace interval required for scanning purposes.

The following circuit constants have proved useful in a sweep generator constructed in accordance with the circuit of FIG. 4:

| | |
|---|---|
| Transformer **25** | 3/1 stepdown, with ferrite core. |
| Condenser **28** | 0.033 microfarad. |
| Condenser **29** | 4 microfarads. |
| Condenser **31** | 3000 micromicrofarads. |
| Inductor **16** | 3 millihenries. |
| Inductor **30** | 1 millihenry. |
| Semiconductive device **18** | Type 1N158; or type 2N158 junction power transistor (emitter and base zones only employed). |
| Resonant frequency of condenser **28** and inductor **16** | 15.75 kilocycles. |
| Resonant frequency of condenser **31** and inductor **30** | About 78.75 kilocycles. |
| Frequency of applied sine wave | 15.75 kilocycles. |

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A signal modifier comprising: periodic alternating-signal supply means; circuit means coupled to said supply means and including means resonant at a frequency at least twice that of the alternating signal; and a semiconductor junction device coupled to said supply means and to said resonant means; said device having a carrier-storage characteristic responsive to said alternating signal to periodically cause shock oscillation of said resonant means to develop across said device a transient signal having a wave form substantially different from that of the alternating signal.

2. A signal modifier comprising: periodic alternating-signal supply means; circuit means coupled to said supply means and including means resonant at a frequency at least twice that of the alternating signal; and a semiconductor junction device coupled to said supply means and to said resonant means; said device having a carrier-storage characteristic responsive to said alternating signal to periodically cut off to produce shock oscillation of said resonant means, each cut-off interval of said device being substantially that of a half period of said resonant frequency, whereby there is developed across said device a transient signal having a wave form substantially different from that of the alternating signal.

3. A signal modifier comprising: a sine-wave signal supply means; circuit means coupled to said supply means and including means resonant at a frequency at least twice that of the sine-wave signal; and a semiconductor junction device coupled to said supply means and to said resonant means; said device having a carrier-storage characteristic responsive to said alternating signal to cut off for an interval of each of periodic half cycles of said sine wave to produce shock oscillation of said resonant means, each cut-off interval of said device being substantially that of a half period of said resonant frequency, whereby there is developed across said device a transient signal having a wave form substantially different from that of the sine-wave signal.

4. A signal modifier comprising: periodic alternating-signal supply means; circuit means coupled to said supply means and including an inductor resonant at a frequency at least twice that of the alternating signal; and a semiconductor junction device coupled to said supply means and to said inductor; said device having a carrier-storage characteristic responsive to said alternating signal to periodically cut off to produce shock oscillation of said inductor, each cut-off interval of said device being substantially that of a half period of said resonant frequency, whereby there is developed across said device a transient signal having a wave form substantially different from that of the alternating signal.

5. A signal modifier comprising: periodic alternating-signal supply means; circuit means including an inductor which is parallel resonant with the inherent capacitance of said circuit means at a frequency at least twice that of the alternating signal; and a semiconductor junction device connected to said supply means in series with said inductor having a carrier-storage characteristic responsive to said alternating signal to periodically cut off to produce shock oscillation of said inductor, thereby developing across said device a transient signal having a wave form substantially different from that of the alternating signal.

6. A signal modifier comprising: periodic alternating-signal supply means; circuit means coupled to said supply means and including means resonant at a frequency at least twice that of the alternating signal; and a semiconductor junction power rectifier coupled to said supply means and to said resonant means; said rectifier having a carrier-storage characteristic responsive to said alternating signal to periodically cut off to produce shock oscillation of said resonant means, each nonconducting interval of said rectifier being substantially that of a half period of said resonant frequency, whereby there is developed across said rectifier a transient signal having a wave form substantially different from that of the alternating signal.

7. A signal modifier comprising: periodic alternating-signal supply means; output circuit means parallel resonant at a frequency at least twice that of the alternating signal; input circuit means coupled to said supply means in series with said output circuit means and including means resonant at the frequency of the alternating signal; and a semiconductor junction device connected across said output circuit means and having a carrier-storage characteristic responsive to said alternating signal to periodically cut off to produce shock oscillation of said output circuit means, each cut-off interval of said device being substantially that of a half period of said resonant frequency whereby there is developed across said output circuit means a transient signal having a wave form substantially different from that of the alternating signal.

8. A sweep generator comprising: a sine-wave voltage supply means; output circuit means parallel resonant at a frequency at least twice that of the alternating signal; input circuit means coupled to said supply means in series with said output circuit means and including an inductor resonant at the frequency of the sine-wave voltage; and a semiconductor junction rectifier connected across said output circuit means and having a carrier-storage characteristic responsive to said sine-wave voltage to periodically produce shock oscillation of said output circuit means for substantially a half-period of said resonant frequency, thereby developing in said output circuit means a periodic scanning current.

9. A signal modifier comprising: periodic alternating-signal supply means including a transformer having primary and secondary windings; circuit means coupled to said secondary winding; means coupled to said secondary winding which is parallel resonant at a frequency at least twice that of the alternating signal; and a semiconductor junction device having a carrier-storage characteristic responsive to said alternating signal to periodically cut off to produce shock oscillation of said resonant means, each cut-off interval of said device being substantially that of a half period of said resonant frequency whereby there is developed across said device a transient signal having a wave form substantially different from that of the alternating signal.

10. A signal modifier comprising: periodic alternating-signal supply means; circuit means coupled to said supply means and including means resonant at a frequency at least twice that of the alternating signal; and a semiconductor junction device coupled to said supply means and to said resonant means; said device having a carrier-storage characteristic responsive to predetermined half cycles of said alternating signal to store carriers in said device in sufficient quantities to maintain it conductive during a first interval of the opposite half cycles, thereby storing energy during each of said first intervals in said resonant means, and such that following selected ones of said first intervals said device becomes nonconductive for a second interval of the same half cycle of said alternating signal to shock-excite said resonant means to complete a half cycle of oscillation by the time said alternating signal enters its succeeding half cycle; whereby a portion of the energy stored in said resonant means during each of said first intervals is returned to said device during the succeeding predetermined half cycle of said alternating signal to augment the storage of carriers therein, and there is developed across said device a periodic transient signal having a wave form substantially different from that of said alternating signal.

11. A signal modifier comprising: sine-wave signal supply means; circuit means coupled to said supply means and including means resonant at a frequency at least twice that of the sine-wave signal; and a semiconductor junction device coupled to said supply means and to said resonant means, said device having a carrier-storage characteristic responsive to predetermined half cycles of said sine-wave signal to store carriers in said device in sufficient quantities to maintain it conductive during a first interval of the opposite half cycles, thereby storing energy during each of said first intervals in said resonant means, and such that following selected ones of said first intervals said device becomes non-conductive for a second interval of the same half cycle of said sine-wave signal to shock-excite said resonant means to complete a half cycle of oscillation by the time said sine-wave signal enters its succeeding half cycle; whereby a portion of the energy stored in said resonant means during each of said first intervals is returned to said device during the suceeeding predetermined half cycle of said sine-wave signal to augment the storage of carriers therein, and there is developed across said device a periodic transient signal having a wave form substantially different from that of said sine-wave signal.

12. A sweep generator comprising: sine-wave signal supply means; first circuit means series resonant at the frequency of said sinusoidal signal; second circuit means parallel resonant at a frequency at least twice that of said sinusoidal signal; means for connecting said second circuit means and said first circuit means in series to said supply means; and a semiconductor junction device connected across said second circuit means; said device having a carrier-storage characteristic responsive to predetermined half cycles of said sine-wave signal to store carriers in said device in sufficient quantities to maintain it conductive for a first interval of the opposite half cycles, thereby storing energy during each of said first intervals in said second circuit means, and such that following selected ones of said first intervals said device becomes nonconductive for a second interval of the same half cycle of said sine-wave signal to shock-excite said second circuit means to complete a half cycle of oscillation by the time said sine-wave signal enters its succeeding half cycle; whereby a portion of the energy stored in said second circuit means during each of said first intervals is returned to said device during the succeeding predetermined half cycle of said sine-wave signal to augment the storage of carriers therein, and there is developed in said second circuit means a periodic scanning current of saw-tooth wave form.

References Cited in the file of this patent

UNITED STATES PATENTS

| | | |
|---|---|---|
| 2,440,465 | Ferguson | Apr. 27, 1948 |
| 2,593,992 | Cutler | Apr. 22, 1952 |
| 2,666,816 | Hunter | Jan. 19, 1954 |
| 2,774,911 | Urtel | Dec. 18, 1956 |
| 2,829,282 | Hughes et al. | Apr. 1, 1958 |
| 2,830,178 | White | Apr. 8, 1958 |
| 2,843,765 | Aigrain | July 15, 1958 |

OTHER REFERENCES

National Bureau of Standards Technical News Bulletin, vol. 38, No. 10, October 1954, pages 145–148, article entitled, Diode Amplifier.